(12) United States Patent
Ouchi (10) Patent No.: US 7,292,744 B2
(45) Date of Patent: Nov. 6, 2007

(54) OPTICAL CONNECTION DEVICE AND OPTOELECTRONIC HYBRID APPARATUS INCLUDING THE SAME

(75) Inventor: Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 10/543,334

(22) PCT Filed: Mar. 1, 2004

(86) PCT No.: PCT/JP2004/002500

§ 371 (c)(1),
(2), (4) Date: Jul. 25, 2005

(87) PCT Pub. No.: WO2004/079420

PCT Pub. Date: Sep. 16, 2004

(65) Prior Publication Data

US 2006/0056757 A1    Mar. 16, 2006

(30) Foreign Application Priority Data

Mar. 5, 2003    (JP) .............................. 2003-058770

(51) Int. Cl.
G02B 6/12    (2006.01)
(52) U.S. Cl. ...................................................... 385/14
(58) Field of Classification Search ...................... None
See application file for complete search history.

(56) References Cited

U.S. PATENT DOCUMENTS

| | | | |
|---|---|---|---|
| 4,838,633 A * | 6/1989 | Katsuyama et al. | 385/14 |
| 5,151,606 A * | 9/1992 | Grieve | 250/551 |
| 5,191,219 A | 3/1993 | Linke | 250/551 |
| 5,268,973 A * | 12/1993 | Jenevein | 385/14 |
| 5,345,557 A * | 9/1994 | Wendt | 710/100 |
| 5,701,325 A | 12/1997 | Ouchi et al. | 372/96 |

(Continued)

FOREIGN PATENT DOCUMENTS

DE    199 48 356 A1    5/2001

OTHER PUBLICATIONS

Machine English translation of description of DE19948356, retrieved via http://v3.espacenet.com/textdes?DB=EPODOC&IDX=DE19948356&F=0&QPN=DE19948356, on Jan. 24, 2007.*

(Continued)

*Primary Examiner*—Rodney Bovernick
*Assistant Examiner*—Mike Stahl
(74) *Attorney, Agent, or Firm*—Fitzpatrick, Cella, Harper & Scinto (57) ABSTRACT

An optical connection device includes: a substrate; an optical waveguide provided in the substrate; and plural optical connection ports provided in the optical waveguide and having at least one of a light output port and a light input port, the light output port outputting light to the optical waveguide, the light input port receiving light from the optical waveguide, and is characterized by further including an arithmetic circuit for, using a key, selectively decoding an optical signal which has been coded in such a manner that it is decoded only at a light input port that is given a key for decoding and which has been outputted from a light output port to the optical waveguide to be received at the light input port.

6 Claims, 9 Drawing Sheets

U.S. PATENT DOCUMENTS

| | | | |
|---|---|---|---|
| 5,850,408 A | 12/1998 | Ouchi et al. | 372/27 |
| 6,046,096 A | 4/2000 | Ouchi | 438/510 |
| 6,055,251 A | 4/2000 | Ouchi et al. | 372/28 |
| 6,089,442 A | 7/2000 | Ouchi et al. | 228/180.1 |
| 6,222,868 B1 | 4/2001 | Ouchi et al. | 372/50 |
| 6,320,691 B1 | 11/2001 | Ouchi et al. | 359/237 |
| 6,477,286 B1 | 11/2002 | Ouchi | 385/14 |
| 6,507,594 B1 | 1/2003 | Furukawa et al. | 372/36 |
| 6,771,677 B2 | 8/2004 | Furukawa et al. | 372/36 |
| 6,836,579 B2 | 12/2004 | Ouchi | 385/14 |
| 6,970,612 B2 | 11/2005 | Ouchi | 385/14 |
| 2003/0086649 A1* | 5/2003 | Zhou | 385/37 |
| 2005/0078902 A1* | 4/2005 | Beausoliel et al. | 385/1 |
| 2005/0215031 A1 | 9/2005 | Ouchi | 438/459 |
| 2005/0233490 A1 | 10/2005 | Kasai et al. | 438/46 |
| 2006/0120668 A1* | 6/2006 | Iwasaki | 385/47 |

OTHER PUBLICATIONS

Tomoaki Ohtsuki et al., "Effects of Hard-Limiter and Error Correction Coding on Performance of Direct-Detection Optical CDMA Systems with PPM Signaling", Communications—Gateway To Globalization. Proceedings. Seattle, Jun. 18-22, 1995, Proceedings Of The Conference On Communications (ICC), New York, US, 1307-1311, XP000534976, ISBN: 0-7803-2487-0.

* cited by examiner

OPTICAL CONNECTION DEVICE AND OPTOELECTRONIC HYBRID APPARATUS INCLUDING THE SAME

TECHNICAL FIELD

The present invention relates to an optical connection device for optically interconnecting an electric circuit substrate and electric chips in a package, and the like through an optical connection port and through an optical waveguide, and relates to an optoelectronic hybrid apparatus or the like that includes the optical connection device.

BACKGROUND ART

A large number of LSI chips which are highly integrated are used to raise the performance of personal computers, cellular phones, mobile machines represented by personal digital assistants (PDAs), digital audio/visual (AV) equipment, and the like that support information-oriented society. A packaging technique that allows such LSI chips to be densely mounted and driven at high speed is being demanded since conventional packaging technologies which use electric connections alone have reached the limit in solving such problems as transmission delay and crosstalk and in reducing electromagnetic interference (EMI). Against this background, a system that uses optical connection in combination with electric connection is being considered.

Figure 9:
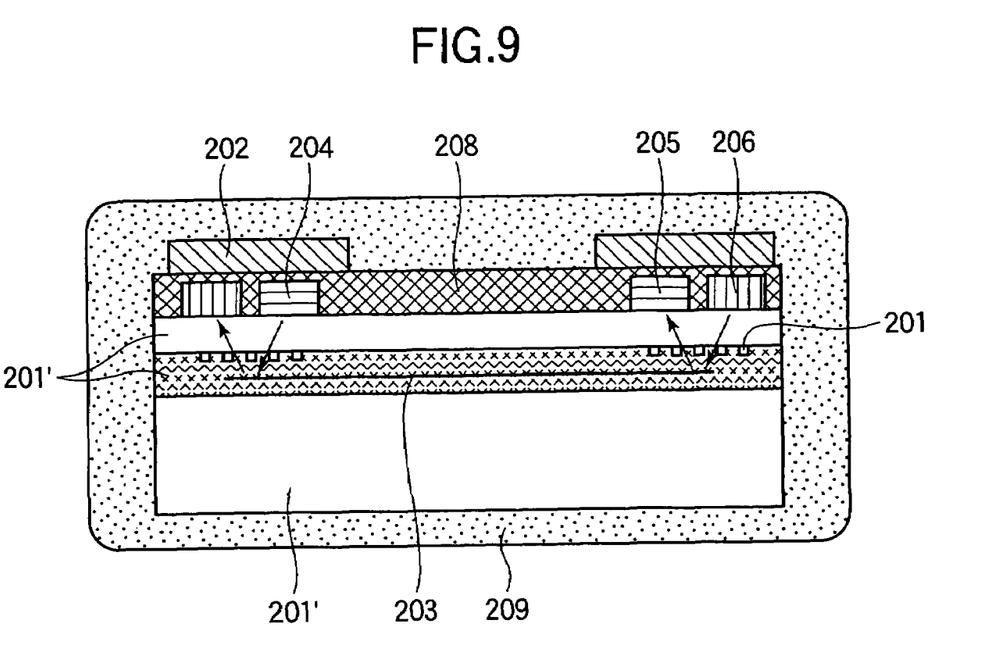
FIG. 9 is a diagram showing an example of a conventional optical connection device that uses a slab optical waveguide.

Several cases of optically interconnecting chips have been proposed. One of those cases is a system in which a slab waveguide is formed from an organic polymer on a flat substrate and is used as a transmission medium. This system supposedly has advantages over a system in which a linear optical waveguide is elaborated, such as having better compatibility with LSI chips and with boards or packages for mounting LSI chips, being easier to manufacture, and allowing chips to interconnect freely. An example of this case is disclosed in JP 08-293836 A. A structural example thereof is shown in FIG. 9. A substrate 201' is equipped with an optical waveguide layer that is sealed with a polymer sealing material 209. An insulating layer 208 of the substrate 201' has transmitter elements 204 and 206 and a receiver element 205. An LSI board 202 is mounted to achieve signal transmission between LSIs through a slab optical waveguide 201" (signal light 203). A hologram 207 is used to optically couple the transmitter elements 204 and 206, the receiver element 205, and the waveguide 201" to one another, and a wavelength-controlling element controls the state of coupling between the elements.

However, the above method, which uses a wavelength-controlling element to control connection between LSI chips, requires the receiver element and the wavelength-controlling element to be highly stable and therefore is difficult to carry out in the vicinity of LSIs where the temperature environment is not always appropriate.

On the other hand, U.S. Pat. No. 5,191,219 discloses the following information processing apparatus. That is, the information processing apparatus comprises means forming a planar optical waveguide which extends in two dimensions and serves as a shared medium, a plurality of light-emitting means and a plurality of light-detecting means extending in a two dimensional arrangement over said planar optical waveguide for broadcasting light signals and abstracting light signals, respectively, into and from said planar optical waveguide, and a plurality of subsystems including input and output ports for processing the light signals in the shared medium, the light-detecting means being coupled to input ports and the light-emitting means being coupled to output ports of the subsystems.

The United States patent discloses the optical connection, but is not much flexible in forming an optical connection.

DISCLOSURE OF THE INVENTION

An object of the present invention is to provide an optical connection device capable of establishing a flexible wiring structure by utilizing optical code division multiplexing (OCDM), encryption and the like while making use of optical waveguide technologies, an example of the flexible wiring structure being wiring reconstruction (reconfigurable wiring) that allows wiring between chips to be reconstructed in a waveguide, and to provide an optoelectronic hybrid apparatus or the like that includes the optical connection device.

An optical connection device according to the present invention includes: a substrate; an optical waveguide provided in the substrate; and plural optical connection ports provided in the optical waveguide and having at least one of a light output port and a light input port, the light output port outputting light to the optical waveguide, the light input port receiving light from the optical waveguide, and is characterized by further comprising an arithmetic circuit for outputting from the light output port into the optical waveguide an optical signal coded so as to be decoded only at a side of the light input port to which a key for decoding is given, and for decoding selectively with the key the optical signal received at the light input port.

This optical connection device enables the light input port (light receiving portion) to selectively receive signals, so that only necessary signals are received, and thus is capable of establishing a flexible wiring structure including wiring reconstruction that makes it possible to change how signals are transmitted between ports as the need arises and a wiring structure for private communications or the like. Furthermore, when plural light input ports are connected to the optical waveguide, the optical connection device can accordingly establish a flexible wiring structure including reconstruction of wiring between the optical connection ports by using optical code division multiplexing or the like. In this case, a flexible wiring structure such as optical reconfigurable wiring is established by utilizing optical code division multiplexing or the like without changing the structure of the optical connection through the optical waveguide substantially, which makes it possible to utilize the advantages of optical connection while avoiding the drawbacks of electric connection. These functions and actions effectively work also for an optoelectronic hybrid apparatus, its driving method, and electronic equipment which are described below.

An optoelectronic hybrid apparatus according to the present invention includes: the optical connection device of the present invention; an electric circuit; and plural electric chips for operating the electric circuit, and is characterized in that optical signals are transmitted and received between the electric chips through the optical connection ports by the arithmetic circuit. The optoelectronic hybrid apparatus may further include a processing circuit for controlling optical signals transmitted and received between the electric chips, in which the processing circuit is connected to the electric chips through electric wiring.

In addition, a method of driving an optoelectronic hybrid apparatus according to the present invention is characterized by including: propagating an optical signal for optical connection between plural electric chips to a specific region or an entirety of the optical waveguide to be receivable by one or more other electric chips than the electric chip that is coding and transmitting; and decoding and receiving a desired optical signal only by the electric chip that is given a key for decoding out of the electric chips that are capable of reception. In the method of driving an optoelectronic hybrid apparatus, coding that satisfies mutual orthogonal relation may enable plural electric chips to simultaneously transmit optical signals in a same optical waveguide and desired signals are decoded by the electric chips that are given corresponding decoding keys to carry out optical code division multiplexing. Further, the apparatus may be run by switching the transmitter electric chip and the receiver electric chip, how the electric chips are connected to one another, and the coding method in order as the need arises. Further, it may be such that the optical signal is modulated with a code that is capable of detecting an error or correcting an error and, when an error is detected in the receiver electric chip, an error detection signal is transmitted to the transmitter electric chip to prompt the transmitter electric chip to re-transmit the optical signal to the receiver electric chip if necessary. Furthermore, it may be such that an error detection signal is transmitted, through electric wires connected to the electric chips, to the processing circuit for controlling transmission and reception of optical signals between the electric chips, and the processing circuit transmits, to the plural electric chips, a control signal that determines a code division multiplexing number, a signal transmission rate, a transmission timing and the like for optical connection between the plural electric chips to control the number of errors for performing optimal control through central management.

An electronic equipment according to the present invention has the optoelectronic hybrid apparatus incorporated, the apparatus being structured to be capable of reconstructing optical connection between the electric chips by a driving method of the present invention, and is characterized in that switching between plural embedded systems is made at a high speed by one equipment.

BEST MODE FOR CARRYING OUT THE INVENTION

Specific embodiments are described below with reference to the drawings to clarify a mode of carrying out the present invention.

Embodiment 1

Figure 1:
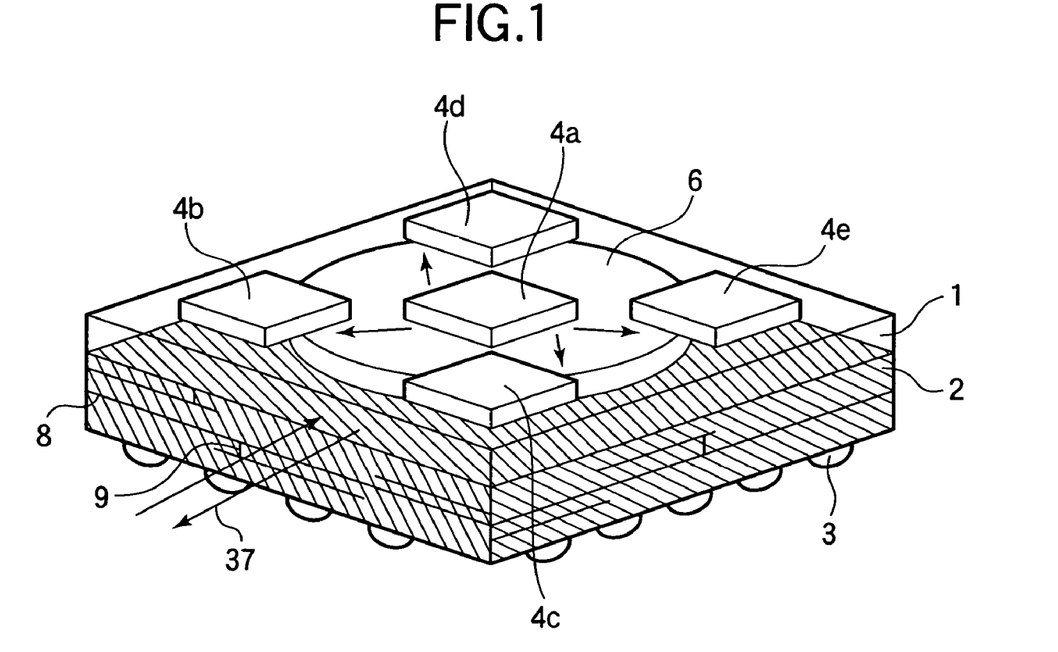
FIG. 1 is a perspective view of an optoelectronic hybrid apparatus according to Embodiment 1 of the present invention.

FIG. 1 shows a perspective view of an optoelectronic hybrid apparatus as Embodiment 1 of the present invention. In this embodiment, a substrate 2 which constitutes multilayer electric wiring and an optical waveguide layer 1 which enables optical free connection are integrated. The optical waveguide layer 1 is a slab waveguide and, as indicated by reference symbol 6 in FIG. 1, is capable of propagating light in every direction. The optical waveguide layer 1 which is a single layer is placed on the top as a result of integration in the mode shown in this drawing, but other modes are employable including one in which layers of optical waveguide are integrated with an electric wiring layer to be placed inside the electric wiring layer.

The material of the substrate 2 that constitutes multilayer electric wiring may be FR4, which is used to form a printed wiring board, or may be an organic material such as polyimide resin or aramid resin, or an inorganic ceramic material such as $Al_2O_3$ or AlN, or glass, or a hybrid material obtained by combining some of those materials. The electric wiring layers are built up such that via holes 9 connect electric wires 8 of the electric wiring layers to one another. An electrode 3 is provided as an interface to the external, to thereby constitute so-called system in package (SiP) in which the entire chip has one function. This means that the chip form is chip size package (CSP), and the package size is 10 mm square to 50 mm square. Passive chips such as a resistor, a capacitor, and a coil, or an IC as an active chip, may be incorporated in the layers of the multilayer electric wiring.

In this embodiment, the optical waveguide layer 1 placed on top of the electric wiring layers as a result of integration is resin formed into a slab that has a thickness of 100 μm. The thickness of the optical waveguide layer 1 is not limited thereto. The waveguide material used here is polycarbonate Z. Other preferable waveguide materials are polyimide, siloxane, SU-8 (a product name), BCB, and polysilane, and organic material polymers obtained by coupling functional groups to principal chains or side chains of those materials, and olygomer and other optical plastic materials that are relatively high in glass transition temperature. Mounted on the waveguide layer 1 are bare chips, Si-Ics 1 to 5 (4a to 4e). Optical connection between the chips is established by light I/O elements (constituting light input and/or output ports which are optical connection ports) integrated under the chips, specifically, by semiconductor lasers and pin photodiodes. The bare chips are preferably so-called wafer-level chip size packages (WLCSPs) in which electrodes for electric connection are created at the same time when ICs are fabricated. For chip interconnection, optical connection is employed in a reconfigurable wiring portion whereas electric connection is built by the electric wires 8 of the substrate 2 through via wires that are formed in the optical waveguide layer 1, or by electric wires that are formed on the optical waveguide layer 1. The IC chips may be LSIs or VLSIs, which are large-scale integrated circuits, and are a mixture of ones having the CPU function, ones having the memory function, and ones having the DSP function. Optical space transmission 37 from the optical waveguide layer 1 also handles connection between the chips and the external. The optical waveguide layer 1 is sized to the substrate 2 but the present invention is not limited to this mode. Instead, the optical waveguide layer may be formed only in a region where the optical waveguide layer is necessary.

Figure 2:
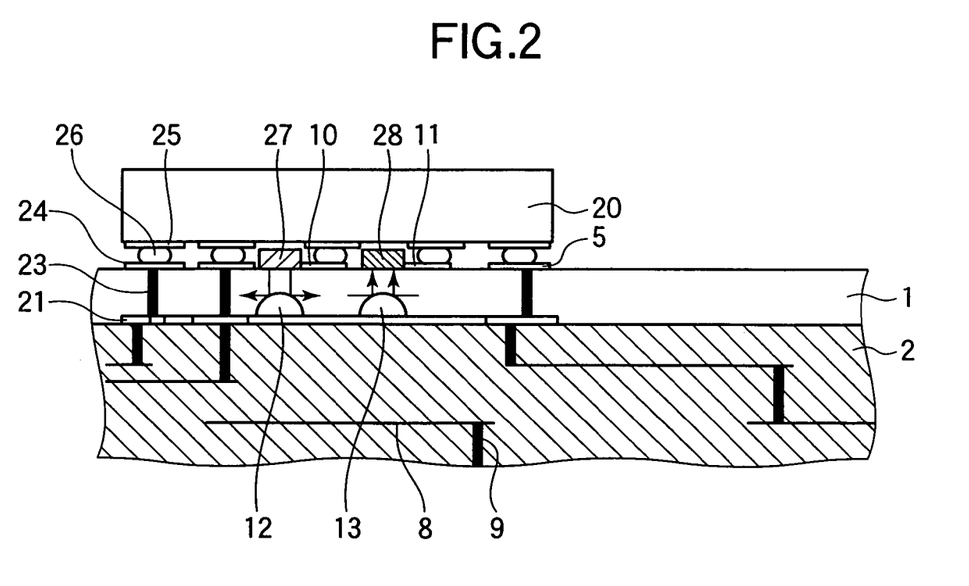
FIG. 2 is a sectional view illustrating chip packaging in the optoelectronic hybrid apparatus according to Embodiment 1 of the present invention.

An example of chip packaging is shown in FIG. 2, which is a sectional view of one chip and its periphery. A bare chip LSI 20 is mounted on the optical waveguide layer 1 between electrodes 24 and 25 with a solder bump 26. Other bumps 26 connect electrodes of the bare chip LSI 20 to an electrode 10 for driving a light emitting element 27, an electrode 11 for driving a light receiving element 28, and an electric wire 5, which is formed on a surface of the optical waveguide layer 1. The electrode 24 is connected to an electric wire 21, which is on the substrate 2, through a via wire 23, which pierces the optical waveguide layer 1. The via wires 9 and the internal wires 8 in the substrate 2 are further used to form an electric circuit. The chips are electrically connected to one another through the electric wire 21 and the internal wires 8.

Figure 3:
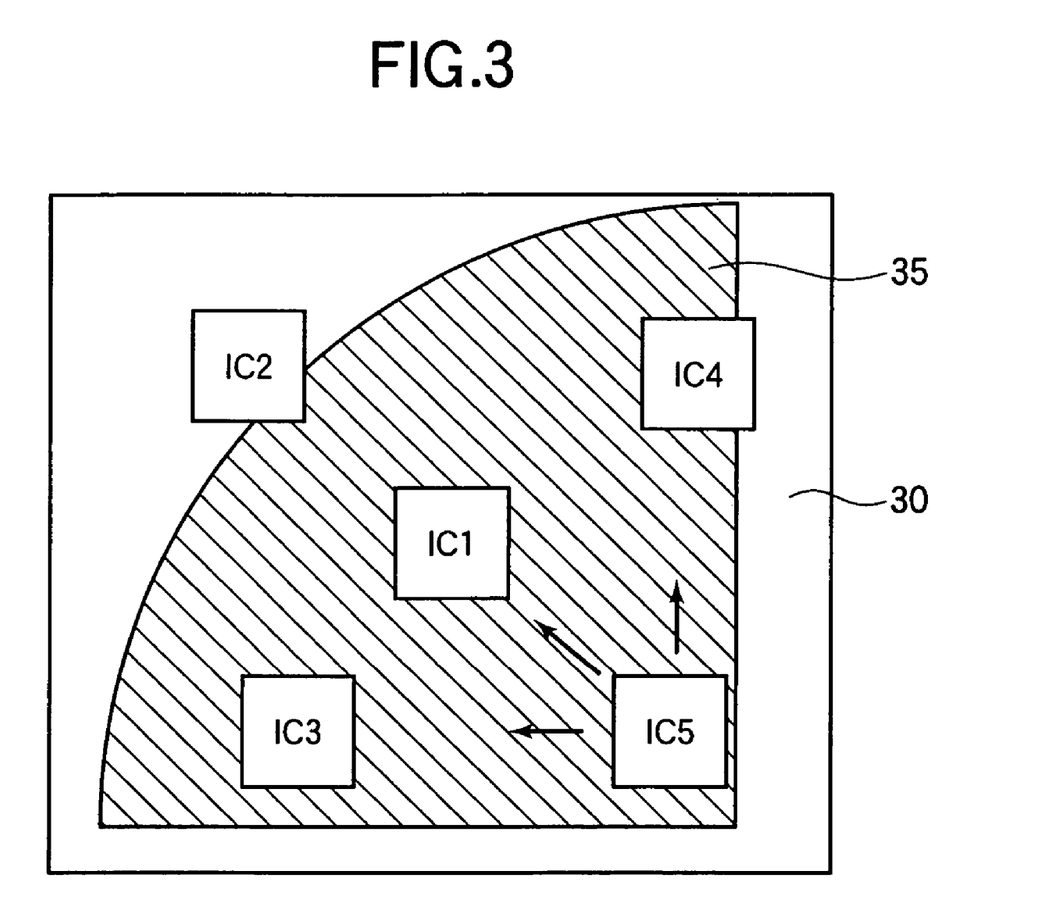
FIG. 3 is a diagram illustrating how an optical signal is transferred in the optoelectronic hybrid apparatus according to Embodiment 1 of the present invention.

This embodiment uses the slab optical waveguide 1 to make optical connection in a broadcast manner as described above. An optical signal from the light emitting element 27 is transmitted by using a hemispherical reflector 12 to couple the signal to the optical waveguide layer 1, and an optical signal propagated from other chips through the optical waveguide layer 1 is received by similarly using a reflector 13 to couple the signal to the light receiving element 28. If the centers of these optical elements match the vertex positions of the reflectors in a vertical direction of the optical waveguide layer 1, the optical elements can be optically coupled to the entire direction of the slab optical waveguide 1 and, in contrast, if decentered, the optical elements are optically coupled to only a region of the slab optical waveguide 1 that has a certain radiation angle. The most appropriate propagation mode is chosen in accordance with the position of the LSI chip and required intensity of light. To elaborate, an IC 1 in a central portion of a substrate (optoelectronic hybrid apparatus) 30, and others like the IC 1, let light exit in 360° directions in order to transmit signals to other IC chips whereas an IC 5 at an edge of the substrate 30 in FIG. 3, and others like the IC 5, only have to let light exit in a necessary direction, for example, a 90° direction (35). In this case, the center of the light emitting element and the vertex of the light reflector in the optical waveguide layer 1 are detuned to limit propagation directions. That way, less light is lost from diffusion of light and the transmission distance is allowed to extend and reach the IC chip in the opposite corner. This is because, while the optical power per unit area is attenuated in proportion to $1/(2\pi R)$, R representing the propagation distance, when light is diffused in 360° directions as long as the propagation loss of the waveguide 1 is sufficiently small, the optical power per unit area is in proportion to $2/(\pi R)$ when propagation is limited in a 90° direction.

The optical elements used in this embodiment can be GaAs-based planar semiconductor lasers, pin photodiodes, and others. With the use of a thin film formed to a thickness of 7 µm on the optical waveguide layer 1 to be integrated after a GaAs substrate is removed (Functional Layer Transfer: FLT), enough height clearance is obtained if normal solder bumps (30 µm φ to 100 µm φ) are used to mount the LSIs. In the case where the GaAs substrate is not removed, spacers (not shown in the drawing) may be inserted between the IC chip 20 and the optical waveguide layer 1 in order to protect the optical elements. The optical elements may be hybrid-integrated on the IC chip or may be buried in the optical waveguide layer 1. When buried in the optical waveguide layer 1, the optical elements lay low in concave portions and therefore eliminate the need for spacers.

Figure 4:
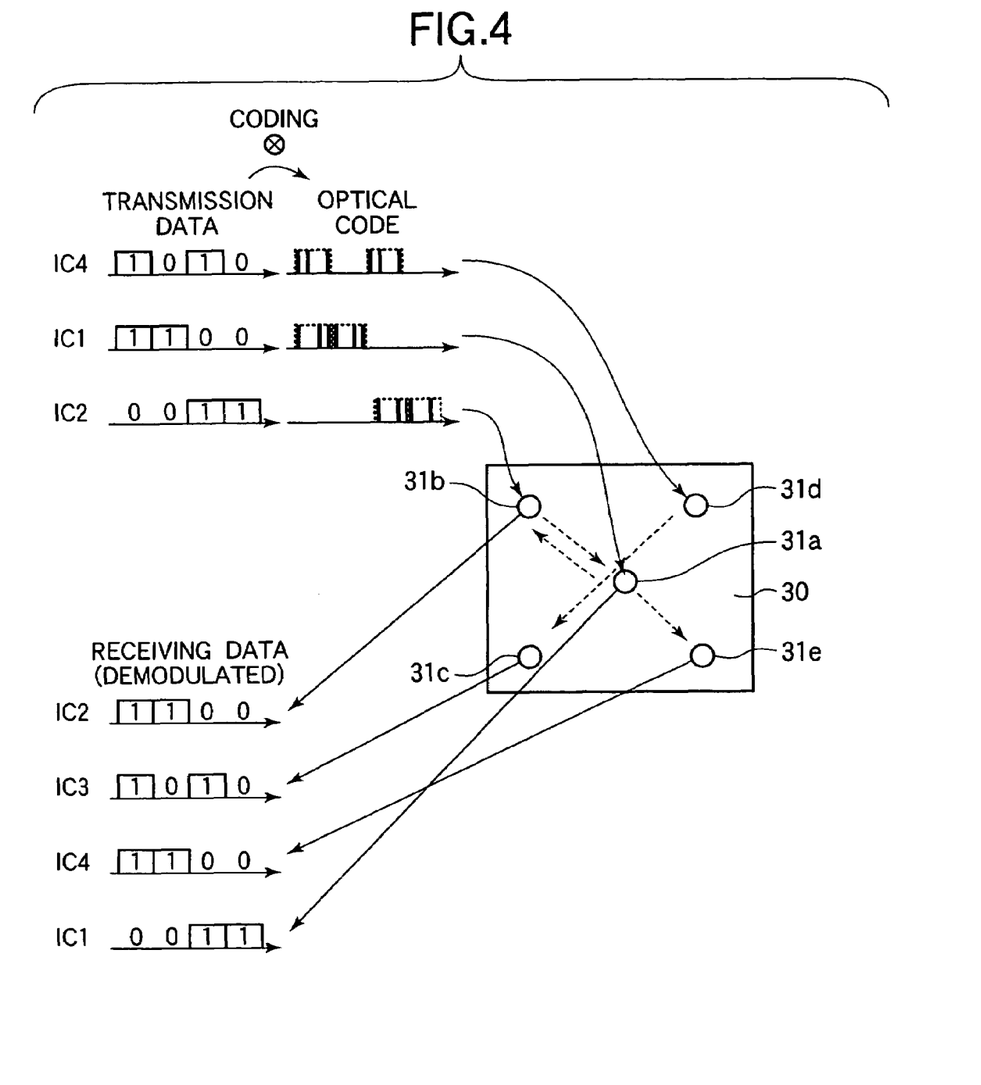
FIG. 4 is a diagram illustrating light exit directions in the optoelectronic hybrid apparatus according to Embodiment 1 of the present invention.

Next, a description is given on control and operation of this reconfigurable optical connection with reference to FIG. 4. FIG. 4 is a plan view in which the optoelectronic hybrid apparatus 30 of FIG. 1 is viewed from above. Circular regions (31a to 31e) represent points of transmitting (output) and/or receiving (input) light of the ICs. Dotted arrows on the optoelectronic hybrid apparatus 30 indicate signal flow between ICs 31, not directions of propagation of light. The optical transmission is broadcast in the slab waveguide as described above and, in addition, all of the IC chips 31 transmit light simultaneously.

Of several code division multiplexing methods, employed here is code multiplexing that uses on-off keying for information modulation and uses a diffusion code in the time slot to diffuse an on signal along the time axis. For that reason, arithmetic circuits (not shown in the drawing) for coding are integrated in each of the ICs 31 so that a light emitting element of a light output port is modulated by output of the arithmetic circuits. For instance, a transmission signal of the IC 4 (31d) is 1010 and is coded at the signal portions of 1 to thereby modulate the light emitting element and obtain an optical code. This makes the optical code rate faster than the clock rate of transmission data which are electric signals, and the code multiplexing number determines the progressive increment. Here, the signal clock rate is set to 1.2 GHz and four pulses are outputted and coded in one time slot, in other words, an optical orthogonal code having a code length of 4 is employed, and optical modulation is therefore carried out at 4.8 Gbps. Transmission data from the rest of the ICs 31, for example, the IC 1 (31a) and IC 2 (31b) are coded differently, so that optical codes are transmitted simultaneously within the same slab waveguide 1. Although the transmission data in FIG. 4 are in synchronous with one another, the transmission data may be asynchronous with one another or may be different from one another in timing to start a signal or in clock frequency.

Reception data can be decoded only by a receiver IC that is given a key for coding carried out by a desired transmitter IC. An unnecessary signal has an orthogonal relation with the given key and becomes zero (namely, forms a cross-correlation waveform) and only a desired signal is outputted as an auto-correlation waveform. For this processing, a matched filter and a threshold circuit (Schmidt trigger or the like) are integrated in an IC and are placed as an arithmetic circuit downstream of a light detector and an amplifier on the light input port side. In FIG. 4, a signal of the IC 4 can be replaced by a signal of the IC 3, a signal of the IC 1 can be replaced by a signal of the IC 2 or IC 5, and a signal of the IC 2 can be replaced by a signal of the IC 1. The signal flow and the number of the ICs operating shown here are merely an example and the present invention is not limited thereto. It is also possible to change how the ICs are connected as time passes.

Coding methods other than the one employed here include a method in which the pulse position is used for secondary modulation upon coding to raise the transmission rate and a method which uses phase shift keying, PSK, for coding. The decision of a coding method to be employed is made in accordance with specification and cost. It is also possible to utilize a wiring structure for private communications through a technique which uses keys to encrypt and decrypt. In this case, light leaked from the waveguide will not be read by outsiders.

As has been described, this embodiment can provide, without using any special optical parts, by simply adding electronic circuits such as an arithmetic circuit for code calculation processing and a controller to an IC chip, a chip-hybrid system LSI capable of wiring reconstruction which allows plural signals to be connected and switched at high speed and high efficiency by optical code division multiplexing or the like with the use of broadcast optical transmission in a slab waveguide.

Embodiment 2

In Embodiment 2 of the present invention, transmission data are error detecting codes or error correcting codes. For instance, when a signal sequence from an IC is composed of n signals, a1, a2, a3, a4, a5, a6, ... an (ai is 0 or 1), there is a method in which α is added to the tail of a code sequence before the sequence is transferred. α is expressed as follows:

$$a1(+)a2(+)a3(+)a4(+)a5(+) \ldots (+) an = \alpha \quad (1)$$

wherein (+) represents addition modulo 2. On the reception side, Expression (1) is calculated to check whether α matches or not and see if there is an error through parity check. If a code error is detected, a signal to notify the fact is transmitted to the IC that has transmitted the error-containing data. The signal that notifies an error may be transferred through electric wiring in an electric wiring layer. Upon receiving the error signal, the IC that has transmitted the error-containing data re-transmits data.

In the case where transmission data is composed of a hamming code, an error can be corrected on the reception side. For instance, when a signal b1, b2, a1, b3, a2, a3, a4, which is obtained by adding 3 bits b1, b2, and b3 as detection sign to 4 bits a1, a2, a3, and a4 for information transmission, b1, b2, and b3 are determined to satisfy the following equations:

$$b3(+)a2(+)a3(+)a4=0$$

$$b2(+)a1(+)a3(+)a4=0$$

$$b1(+)a1(+)a2(+)a4=0$$

In this example, error correction is possible for 1 bit and error detection is possible for 2 bits. If there are too many errors to correct, a signal for notifying the fact is transferred to the IC that has transmitted the data.

The code multiplexing number and the transmission rate may be controlled by the incidence of such error correction. To elaborate, while Embodiment 1 shows that signals can be transmitted from and received by ICs asynchronously, in practice, the error incidence could be increased depending on the multiplexing number due to an increase in noise of when a matched filter is used for processing. If this is monitored with the use of an error correction code or the like, total control for reducing errors is achieved.

Figure 5A:
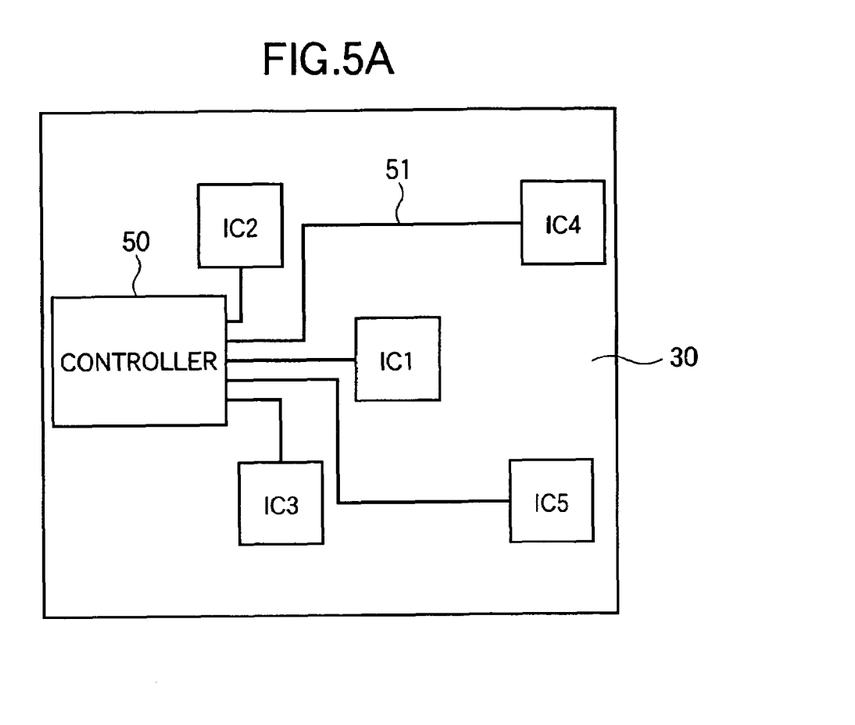
FIGS. 5A and 5B are diagrams illustrating a method of controlling an optical signal in an optoelectronic hybrid apparatus according to Embodiment 2 of the present invention.
Figure 5B:
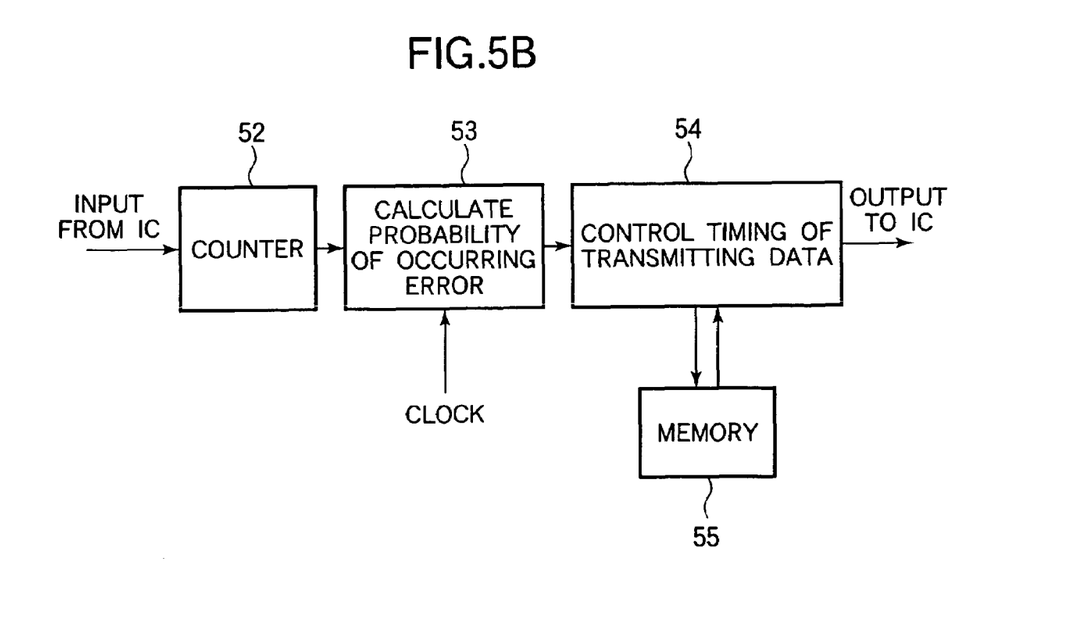

To this end, a processing circuit 50 for controlling the number of errors is added as shown in FIG. 5A, for example. The processing circuit 50 is composed of a counter 52, a circuit 53, and a circuit 54 as shown in FIG. 5B. The counter 52 counts the number of errors. The circuit 53 calculates the error incidence. The circuit 54 controls the signal distribution of transmission data and timing such as transmission rate. The processing circuit 50 is connected to the ICs through signal lines 51, which are provided by electric wiring in an electric circuit substrate. In some cases, transmission between some of the ICs may be stopped to transmit a burst of signals. For such signal transmission control, the processing circuit 50 may be operated consulting a memory 55, in which the order of priority of signal transmission between the chips is programmed in advance. Although FIG. 5A illustrates how the processing circuit 50 and the chips are connected, other things are arbitrary including what wiring pattern is to be employed, whether the circuit and the chips are to be placed on the top face or the bottom face of the optical waveguide layer, whether or not internal wiring of the electric circuit substrate is employed.

Such central management in which the error incidence is controlled in a concentric manner is beneficial when code multiplexing transmission is carried out in a small region, since optimum control is achieved without delay. Of course, it is also possible to employ, as in optical communication systems, distributed control in which every IC is notified of error information to control the error incidence. In this embodiment, the processing circuit 50 transmits, to plural electric chips, in accordance with the number of errors, a control signal that determines the code multiplexing number, transmission timing, and the transmission rate for connection between the ICs. Thus optimum control is achieved by central management and it enables the embodiment to provide a chip-hybrid system LSI which is capable of wiring reconstruction and which is highly reliable with reduced signal processing errors.

This embodiment too can provide, without using any special optical parts, by simply adding electronic circuits such as an arithmetic circuit for code calculation processing and a controller to an IC chip, a chip-hybrid system LSI capable of wiring reconstruction which allows plural signals to be connected and switched at high speed and high efficiency by optical code division multiplexing or the like with the use of broadcast optical transmission in a slab waveguide.

Embodiment 3

In Embodiment 3 of the present invention, combinations of signal transfer between IC chips and keys for coding are programmed in advance to run the system by central management. The structure thereof is similar to the one described in Embodiment 2 and shown in FIG. 5. To be specific, control is made by transferring transmission timing and reception timing of the ICs and keys for coding through the wires 51 to the chips in accordance with a sequence read out of the memory. This may be carried out at the same time when the error incidence control described in Embodiment 1 takes place.

Figure 6:
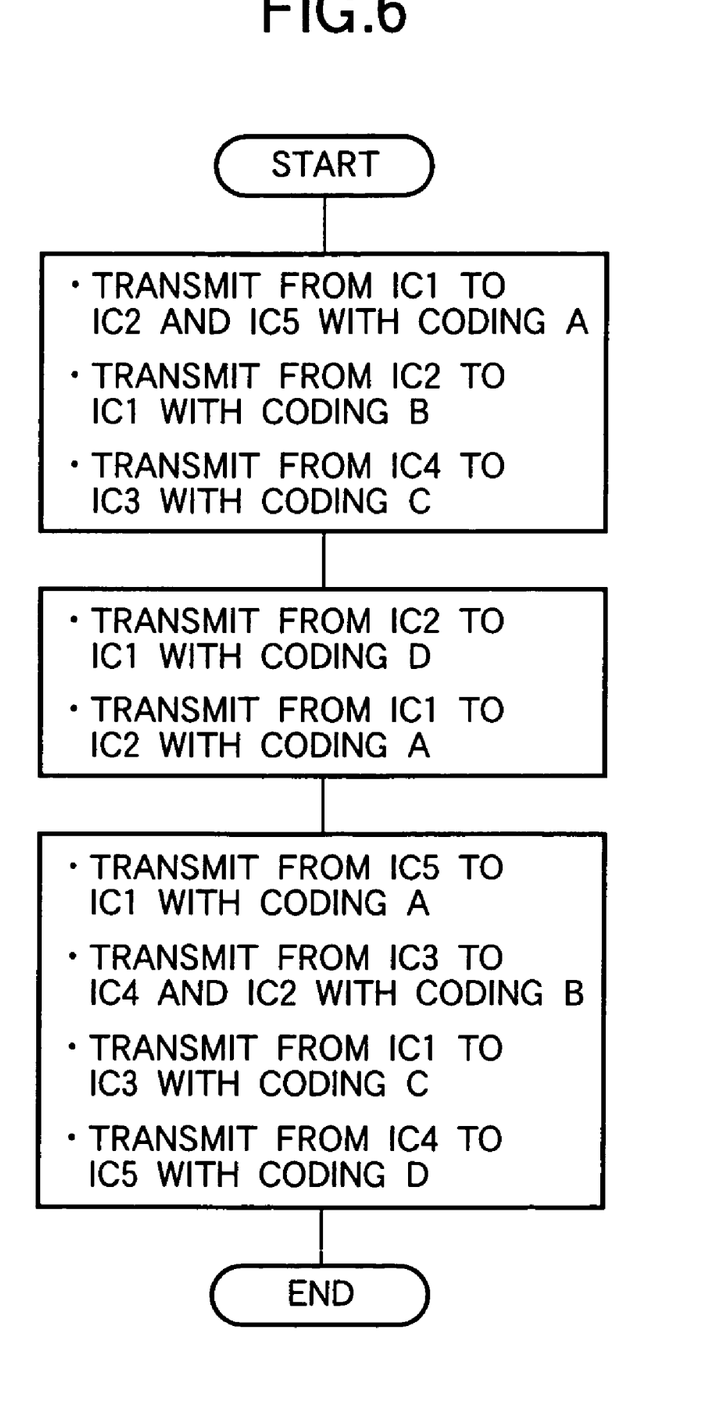
FIG. 6 is a flow chart example for optical code division multiplexing according to Embodiment 3 of the present invention.

A flow chart example is shown in FIG. 6. With a start signal, three signal exchange frames are executed sequentially. To elaborate, signals are transmitted between the IC chips frame by frame, and how the IC chips are connected, coding, and the like are combined freely as shown in FIG. 6. The processing circuit 50 executes control in a manner that achieves the optimum transmission in each frame, in other words, in a manner that makes the signal exchange time including error correction the shortest.

Figure 7:
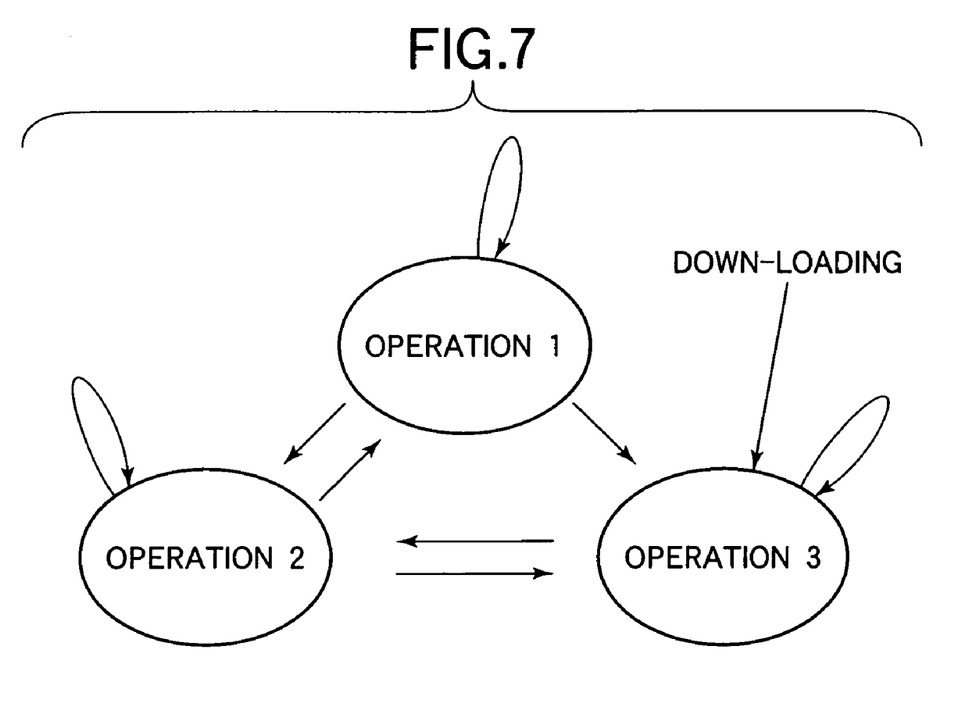
FIG. 7 is a diagram illustrating an example of state transition according to Embodiment 3 of the present invention.

To run actual embedded equipment, a sequence for shifting between those operations is incorporated. FIG. 7 is a diagram showing an example of the state transition. The equipment operates while being shifted between programmed operations by some kind of switch SW (e.g., externally-conducted switching operation). Depending on the situation, a unique operation program may be downloaded from an outside source to the memory to add a new function to the equipment or upgrade the equipment. How signals are connected thus can be changed by a method of executing a sequence which is programmed in advance to give a key for coding and a method of downloading a program from an outside source to add to or write over the existing program.

Figure 8:
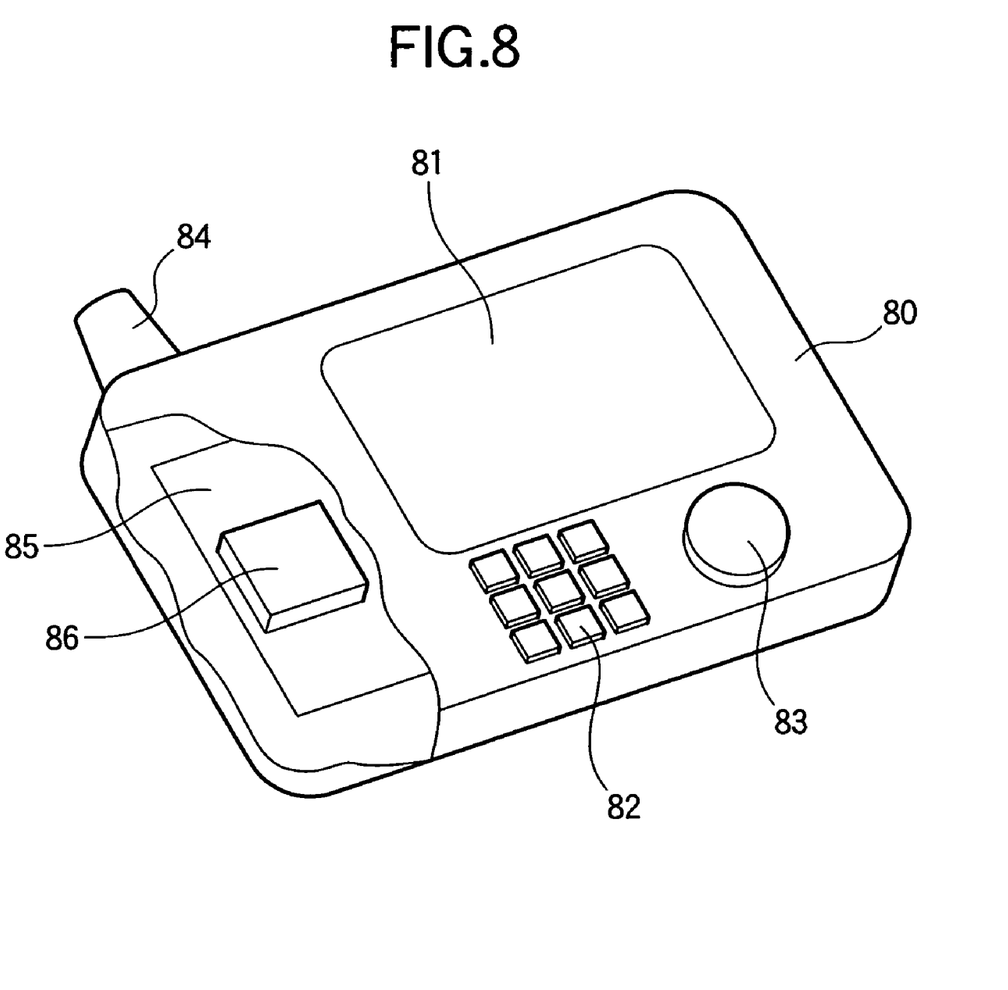
FIG. 8 is a diagram showing a mobile terminal according to the present invention.

As an example of equipment suitable for such operation, FIG. 8 shows a mobile terminal 80 whose embedded system employs the above-described structure. The mobile terminal 80 is equipped with a man-machine interface and a radio unit. The interface includes a display portion 81, a button manipulation portion 82, a dial manipulation portion 83, and others. The radio unit includes an antenna 84 for exchanging signals with the external. Provided inside the mobile terminal 80 are a main board 85 and a chip or package 86 with optical reconfigurable wiring of the present invention built in. The main board 85 and the chip or package 86 constitute the embedded system.

Lately, there are many wireless systems including WCDMA and CDMA 2000x public cellular phone networks, PHS, wireless LAN (such as IEEE 802.11a, b), wireless IEEE.1394, ultra wide band (UWB), and Bluetooth. Smooth switching between these systems and a radio unit capable of processing these systems with one chip are expected. An optoelectronic hybrid chip of the present invention makes a so-called software radio reality, and is capable of switching between plural wireless systems dynamically at high speed. Therefore, small-sized digital electronic equipment capable of high-speed processing can be provided.

For various systems other than software radio, an optoelectronic hybrid chip of the present invention can handle multimedia processing in which audio and visuals are given, for example, compression and expansion, at high speed. It is also possible to let an optoelectronic hybrid chip of the present invention function alone as a small-sized, high-performance, wireless tag or to build a large-scale embedded system such as a robot by coupling a large number of chips to one another. In addition to these uses, an optoelectronic hybrid chip of the present invention can be applied to electronic equipment in general that needs embedding processing to improve the performance of such electronic equipment. For example, the present invention can be used to build copying machines, printers, and other OA equipment that are capable of high-speed multimedia processing, image pickup apparatus, and measuring equipment capable of high-speed conversion.

An optoelectronic hybrid apparatus in which the above-described IC chips, optical connection device, and electric wiring layer are unified, is a system LSI which is densely packaged and which can switch systems at high speed, and can function as SoC which exhibits multiple functions with one chip or as SiP which is made into a package to be mounted to an electric circuit substrate. It is also possible to utilize the optoelectronic hybrid apparatus as an optoelectronic hybrid substrate to serve as one daughter board. Thus an apparatus of the present invention encompasses all levels from the chip level to the substrate level by way of size, packaging method, application method, operation system, etc.

This makes it possible to provide, at relatively low cost, densely-packaged electronic equipment or the like in which plural architectures are built from minimum chips and wires, a switch is readily made between different architectures, and high-speed multimedia processing is possible. Also, optimum processing can be performed by choosing a necessary embedded system on site and, in addition, switching between the systems can be made at high speed by simple control.

As described above, according to the present invention, an optical connection device capable of establishing a flexible wiring structure such as wiring reconstruction is provided and the device makes it possible to switch transmission signals in electronic equipment or the like by utilizing optical code multiplexing, encryption, and the like.

The invention claimed is:

1. An optoelectronic apparatus, which comprises an optical connection device, an electric circuit, and plural electric chips:

said optical connection device comprising:

a substrate;

an optical waveguide provided in the substrate;

plural optical connection ports provided in the optical waveguide and having a light output port and a light input port, wherein the light output port is for outputting light to the optical waveguide, and the light input port is for receiving light from the optical waveguide; and an arithmetic circuit for outputting from the light output port into the optical waveguide an optical signal coded so as to be decoded only at a side of the light input port to which a key for decoding is given, and for decoding selectively with the key the optical signal received at the light input port, wherein said plural electric chips are for operating said electric circuit, and the optical signal is transmitted and received between the electric chips through the optical connection ports and the arithmetic circuit, and wherein the optical signal for optical connection between plural electric chips is propagated to a specific region or an entirety of the optical waveguide to be receivable by one or more receiver electric chips other than an electric chip that codes and transmits, so that a desired optical signal is coded in a manner that satisfies a mutual orthogonal relation that enables plural electric chips to simultaneously transmit plural optical signals in a same optical waveguide, and to decode and be received only by an electric chip that is given a key for decoding to carry out optical code division multiplexing, based on a switching of a connection between the electric chip that codes and transmits and a said receiver electric chip.

2. An optoelectronic apparatus according to claim 1, further comprising a processing circuit for controlling optical signals transmitted and received between the electric chips characterized in that the processing circuit is connected to the electric chips through electric wiring.

3. The optoelectronic apparatus according to claim 1, characterized in that the optical signal is modulated with a code that is capable of detecting an error or correcting an error and, when an error is detected in a said receiver electric chip, an error detection signal is transmitted to the electric chip that transmits to prompt the electric chip that transmits to re-transmit the optical signal to the receiver electric chip if necessary.

4. The optoelectronic apparatus according to claim 1, characterized in that an error detection signal is transmitted, through electric wires connected to the electric chips, to the processing circuit for controlling transmission and reception of optical signals between the electric chips, and the processing circuit transmits, to the plural electric chips, a control signal that determines a code division multiplexing number, a signal transmission rate, a transmission timing, for optical connection between the plural electric chips to control the number of errors for performing optimal control through central management.

5. An electronic equipment which includes the optoelectronic apparatus according to claim 1, characterized in that switching between plural embedded systems is made by one equipment.

6. The optoelectronic apparatus according to claim 1, characterized in that the apparatus is run by switching the electric chip that transmits and a said receiver electric chip, how the electric chips are connected to one another, and a coding method in order as the need arises.

* * * * *

UNITED STATES PATENT AND TRADEMARK OFFICE
CERTIFICATE OF CORRECTION

PATENT NO. : 7,292,744 B2 Page 1 of 1
APPLICATION NO. : 10/543334
DATED : November 6, 2007
INVENTOR(S) : Toshihiko Ouchi It is certified that error appears in the above-identified patent and that said Letters Patent is hereby corrected as shown below:

<u>COLUMN 6</u>

Line 39, "in synchronous" should read --synchronous--.

<u>COLUMN 10</u>

Line 63, "the" (second occurrence) should read --a--.

Signed and Sealed this

Twenty-third Day of September, 2008

JON W. DUDAS
*Director of the United States Patent and Trademark Office*